United States Patent
Zhao et al.

(10) Patent No.: US 12,387,919 B2
(45) Date of Patent: Aug. 12, 2025

(54) ALD PROCESS WITH PLASMA TREATMENT

(71) Applicant: Tokyo Electron Limited, Tokyo (JP)

(72) Inventors: Jianping Zhao, Austin, TX (US);
Toshihiko Iwao, Austin, TX (US);
Peter Lowell George Ventzek, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 20 days.

(21) Appl. No.: 18/067,378

(22) Filed: Dec. 16, 2022

(65) Prior Publication Data

US 2024/0203706 A1    Jun. 20, 2024

(51) Int. Cl.
| C23C 16/505 | (2006.01) |
| C23C 16/34 | (2006.01) |
| C23C 16/455 | (2006.01) |
| H01J 37/32 | (2006.01) |
| H01J 37/317 | (2006.01) |

(52) U.S. Cl.
CPC ...... H01J 37/32724 (2013.01); C23C 16/345 (2013.01); C23C 16/4554 (2013.01); C23C 16/45553 (2013.01); C23C 16/505 (2013.01); H01J 37/32082 (2013.01); H01J 37/32816 (2013.01); H01J 37/317 (2013.01); H01J 2237/2001 (2013.01); H01J 2237/332 (2013.01)

(58) Field of Classification Search
CPC .............. C23C 16/4554; C23C 16/345; C23C 16/45538; C23C 16/45536; C23C 16/45542; C23C 16/45525; C23C 16/505; H01L 21/28562; H01L 21/0228
See application file for complete search history.

(56) References Cited

U.S. PATENT DOCUMENTS

| 9,246,099 B1* | 1/2016 | Hsueh ............... C23C 16/45544 |
| 2005/0221021 A1 | 10/2005 | Strang |
| 2012/0028454 A1* | 2/2012 | Swaminathan ....... C23C 16/045 118/704 |
| 2019/0057858 A1* | 2/2019 | Hausmann .......... H01L 21/0228 |
| 2022/0301823 A1* | 9/2022 | Yoo .................. H01J 37/32082 |
| 2022/0310385 A1 | 9/2022 | Tapily |

OTHER PUBLICATIONS

Xin Meng et al, Materials, 9, 1007(2016) pp. 1-20 (Year: 2016).*

(Continued)

*Primary Examiner* — Tabassom Tadayyon Eslami
(74) *Attorney, Agent, or Firm* — Slater Matsil, LLP

(57) ABSTRACT

A method of processing a substrate that includes: in a plasma processing chamber, performing an atomic layer deposition (ALD) process including cycles of deposition while maintaining a temperature of a substrate support between 25° C. and 450° C., one of the cycles including exposing the substrate loaded in a plasma processing chamber to a first precursor to modify a surface of the substrate with the first precursor, after exposing the substrate, purging the plasma processing chamber with an inert gas, exposing the modified surface of the substrate to a first plasma generated from the inert gas, and flowing a second precursor into the plasma processing chamber, after exposing to the first plasma, to form a conformal layer from the modified surface.

14 Claims, 10 Drawing Sheets

(56) References Cited

OTHER PUBLICATIONS

Z. C. Sobell et al, Chem Matter. 2020, 34, 9624-9633, here after Sobell (Year: 2020).*
Lee et al Journal of the Korean Physical Society, vol. 47, Nov. 2005, pp. S598-S602 (Year: 2005).*
Meng et al., "Atomic Layer Deposition of Silicon Nitride Thin Films: A Review of Recent Progress, Challenges, and Outlooks," Materials, vol. 9, No. 12, www.mdpi.com/journal/materials, doi:10.3390/ma9121007, Dec. 12, 2016, 20 pages.

* cited by examiner

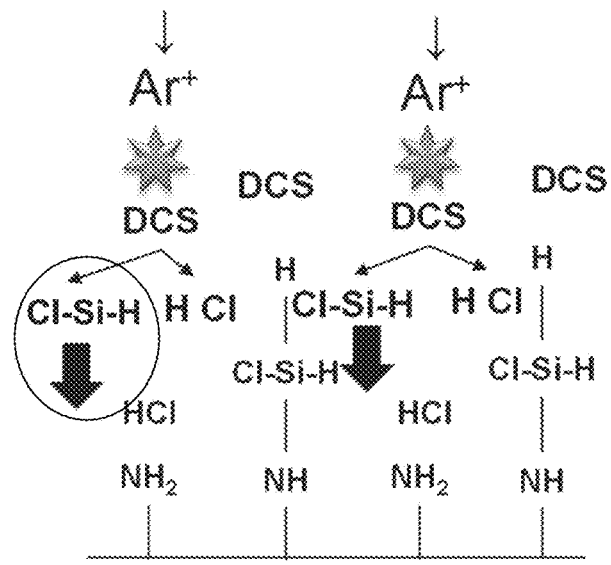
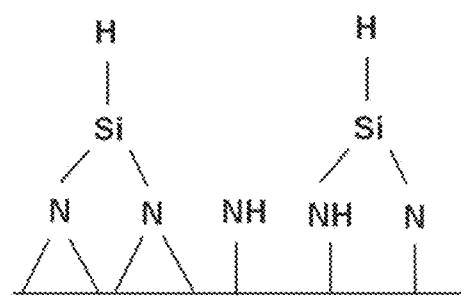
FIG. 2A
FIG. 2B
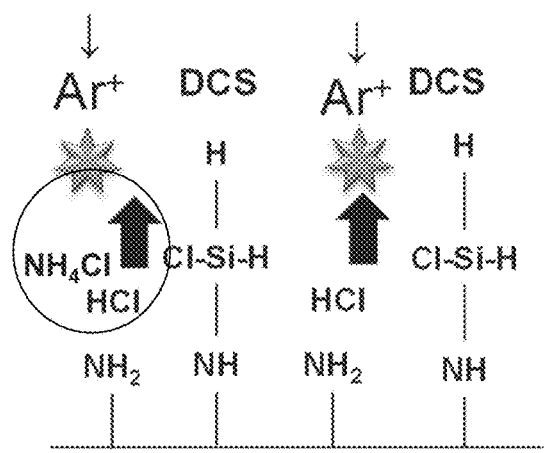
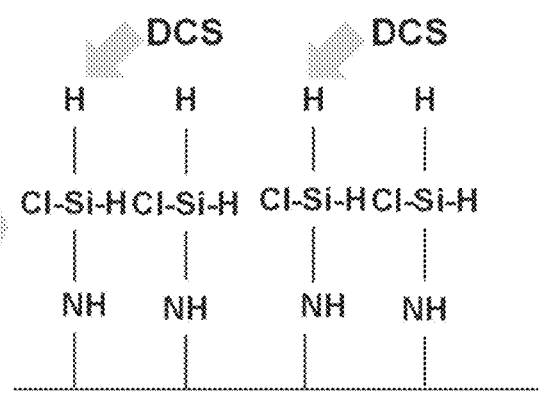
FIG. 2C
FIG. 2D

ALD PROCESS WITH PLASMA TREATMENT

TECHNICAL FIELD

The present invention relates generally to methods of processing a substrate, and, in particular embodiments, to atomic layer deposition (ALD) process with plasma treatment.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Scaling efforts to increase the number of interconnect elements per unit area are running into greater challenges as scaling enters nanometer-scale semiconductor device fabrication nodes. Therefore, there is a desire for three-dimensional (3D) semiconductor devices in which transistors are stacked on top of each other. As device structures densify and develop vertically, the desire for precision material processing, for example, during deposition and patterning, becomes more compelling. Thus, further innovations are desired in various deposition techniques such as chemical vapor deposition (CVD), physical vapor deposition (PVD), and atomic layer deposition (ALD), to provide sufficient deposition rate, profile control, film conformality, and film quality among others.

SUMMARY

In accordance with an embodiment of the present invention, a method of processing a substrate that includes: in a plasma processing chamber, performing an atomic layer deposition (ALD) process including cycles of deposition while maintaining a temperature of a substrate support between 25° C. and 450° C., one of the cycles including exposing the substrate loaded in a plasma processing chamber to a first precursor to modify a surface of the substrate with the first precursor, after exposing the substrate, purging the plasma processing chamber with an inert gas, exposing the modified surface of the substrate to a first plasma generated from the inert gas, and flowing a second precursor into the plasma processing chamber, after exposing to the first plasma, to form a conformal layer from the modified surface.

In accordance with an embodiment of the present invention, a method of processing a substrate that includes: flowing an inert gas to a plasma processing chamber; while flowing the inert gas, forming a conformal dielectric layer over the substrate, the forming including flowing a vapor precursor into the plasma processing chamber in the absence of a plasma, a portion of the vapor precursor being adsorbed on a surface of the substrate, after terminating the flow of the vapor precursor, generating a first RF plasma from the inert gas in the plasma processing chamber and exposing the substrate to the first RF plasma, flowing an activation gas to the plasma processing chamber to react the activation gas with the adsorbed vapor precursor to form the conformal dielectric layer.

In accordance with an embodiment of the present invention, a method of processing a substrate that includes: in a plasma processing chamber, performing an atomic layer deposition (ALD) process including cycles of deposition while maintaining a temperature of a substrate support between 25° C. and 450° C., each cycle of deposition including adsorbing a Si-containing precursor onto a surface of the substrate with a dose of the Si-containing precursor being between 0.1 Torr·s and 5.0 Torr·s, after adsorbing the Si-containing precursor, performing an additional treatment for the substrate that induces a decomposition of the Si-containing precursor and dissociative adsorption or that removes a side-product generated during a previous cycle of deposition from the substrate, and after the additional treatment the substrate, forming a conformal layer, the forming including exposing the substrate to a plasma generated from a gas including nitrogen.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1D illustrate cross sectional views of a substrate at various stages during an atomic layer deposition (ALD) process in accordance with various embodiments, wherein FIG. 1A illustrates a substrate during a precursor dosing step, FIG. 1B illustrates the substrate during a plasma treatment, FIG. 1C illustrates the substrate during an activation step, and FIG. 1D illustrates the substrate after cycles of ALD steps;

FIGS. 2A-2D illustrate two possible mechanisms for surface modification induced by a plasma treatment in accordance with various embodiments, wherein FIG. 2A illustrates the decomposition of adsorbed precursors, FIG. 2B illustrates the resulting dissociative adsorption after the decomposition in FIG. 2A, FIG. 2C illustrates the removal of by-products generated from deposition, and FIG. 2D illustrates the improved adsorption after the removal in FIG. 2C;

FIGS. 3A-3E illustrate example timing diagrams for one cycle of ALD process in accordance with various embodiments, wherein FIG. 3A illustrates an embodiment with an additional plasma treatment, FIG. 3B illustrates another embodiment, FIG. 3C illustrates yet another embodiment, FIG. 3D illustrates another embodiment with two additional plasma treatments, and FIG. 3E illustrates yet another embodiment with an additional treatment without plasma;

FIGS. 4A-4B illustrate cross sectional views of a substrate at various stages during an atomic layer deposition (ALD) process in accordance with embodiments, wherein FIG. 4A illustrates a substrate during a plasma treatment with a photomask to enable area selective film growth, and FIG. 4B illustrates the substrate after cycles of ALD steps.

FIGS. 5A-5C illustrate process flow diagrams of the methods of ALD process in accordance with various embodiments, wherein FIG. 5A illustrates an embodiment first process flow diagram, FIG. 5B illustrates an embodiment of another process flow diagram, and FIG. 5C illustrates yet another process flow diagram; and FIGS. 6A-6B illustrate example X-ray photoelectron spectra (XPS) of a substrate after ALD process, wherein FIG. 6A illustrates a Si 2p XPS spectrum of the substrate after a ALD process without any additional plasma treatment, and wherein FIG. 6B illustrates a Si 2p XPS spectrum of the substrate after a ALD process with an additional plasma treatment in accordance with an embodiment.

DETAILED DESCRIPTION OF ILLUSTRATIVE EMBODIMENTS

Figure 1A:
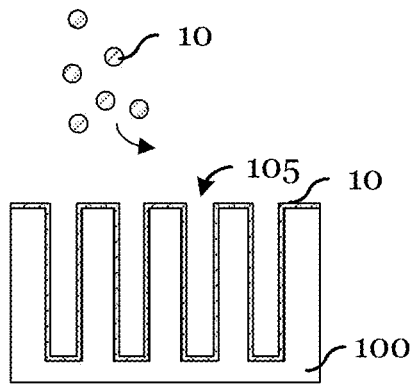

This application relates to methods of film deposition, more particularly to atomic layer deposition (ALD) process with plasma treatment.

With scaling efforts in semiconductor fabrication processes, it becomes more imperative to achieve conformal film coverage with high aspect ratio structures and/or 3D structures. Atomic layer deposition (ALD), where a film is grown layer-by-layer through cyclically repeated steps of precursor dosing and its activation, is a powerful deposition technique with sufficient film conformality. However, ALD processes are generally slow (e.g., a film growth rate of 1-2 nm/min.) and expensive. Two types of ALD processes, thermal ALD and plasma-enhanced ALD (PEALD), have their advantages and disadvantages, respectively. Typically, thermal ALD may provide a good film growth rate with high film quality at high substrate temperature (e.g., >600° C. for SiN film growth), but the high substrate temperature often exceeds the thermal budget, causing dopant redistribution and other device degradation. On the other hand, plasma-enhanced CVD (PECVD) enables film growth at lower temperatures, but the film growth is still slow. Furthermore, ALD processes generally require high precursor dose (i.e., precursor partial pressure×exposure time) for the film quality and growth. Therefore, improvements of ALD methods may be highly desired.

Embodiments of the present application disclose methods of atomic layer deposition (ALD) with low precursor dose and at low substrate temperature. The methods may advantageously improve the film growth rate with low precursor dose at low substrate temperature by inserting an additional plasma treatment between a precursor dosing step and an activation step. The inventors of this application identified that, with this additional plasma treatment, it is possible to achieve a high growth rate per cycle (GPC) of ALD that is equivalent to the maximum monolayer growth per cycle. In various embodiments, the additional plasma treatment may only require an inert gas (e.g., argon) as the process gas. In one embodiment, despite a low dose and a low substrate temperature, silicon nitride film may be grown at a GPC of 2.3-2.8 Å, which is approximately a monolayer growth per cycle. The methods may advantageously be applied to ALD of various dielectric (e.g., nitride, oxide, or carbide) and metal materials.

In the following, the steps of low-dose, low-temperature ALD process are first described referring to FIGS. 1A-1D. The effect of the additional plasma treatment on an exposed surface is then described referring to FIGS. 2A-2D, followed by FIGS. 3A-3E illustrating example timing diagrams. Example process flow diagrams are then illustrated in FIG. 4A-4C. Some exemplary experimental data are described for the improvement in film growth rate referring to FIGS. 5A-5B. All figures in this disclosure are drawn for illustration purpose only and not to scale, including the aspect ratios of features.

FIGS. 1A-1D illustrate cross sectional views of a substrate 100 being processed in a plasma processing chamber at various stages of an atomic layer deposition (ALD) process in accordance with various embodiments.

FIG. 1A illustrates a cross sectional view of the substrate 100 during a precursor dosing step in which the substrate 100 comprising recesses 105 is exposed to a precursor 10 prior to the plasma deposition steps (e.g., the plasma treatment followed by the activation step). In various embodiments, the substrate 100 may be a part of, or includes, a semiconductor device, and may have undergone a number of steps of processing following, for example, a conventional process. The substrate 100 accordingly may comprise layers of semiconductors useful in various microelectronics. For example, the semiconductor structure may comprise the substrate 100 in which various device regions are formed.

In one or more embodiments, the substrate 100 may be a silicon wafer, or a silicon-on-insulator (SOI) wafer. In certain embodiments, the substrate 100 may comprise a silicon germanium wafer, silicon carbide wafer, gallium arsenide wafer, gallium nitride wafer and other compound semiconductors. In other embodiments, the substrate 100 comprises heterogeneous layers such as silicon germanium on silicon, gallium nitride on silicon, silicon carbon on silicon, as well layers of silicon on a silicon or SOI substrate. In various embodiments, the substrate 100 is patterned or embedded in other components of the semiconductor device.

The substrate 100 may be patterned, for example into one or more high aspect ratio features and/or 3D structures. In various embodiments, the features of the substrate 100 may comprise a contact hole, slit, or other suitable structures comprising a recess. In certain embodiments, the features of the substrate 100 may include various 3D structures and layers useful for example in 3D-NAND, 3D-NOR, or dynamic random access memory (DRAM) device as well as 3-D transistors. In FIG. 1A, recesses 105 are formed over the substrate 100. The patterning of the substrate 100 may be formed by a conventional method, for example, a lithography process to pattern an etch mask and a subsequent etch process. Although the substrate 100 in FIG. 1A is illustrated with straight recess features for illustration purpose, the substrate 100 may have any other structural features useful for semiconductor devices.

As further illustrated in FIG. 1A, the ALD process in various embodiments may start with the precursor dosing step, where a precursor 10, in a vapor phase, may be flowed into the plasma processing chamber that houses the substrate 100. A portion of the precursor 10 may adsorb on the surface of the substrate 100. In various embodiments, the precursor 10 may be diluted in a carrier gas such as argon (Ar) or other inert gases. In certain embodiments, the methods of ALD may be applied to a low precursor dose regime (e.g., <5.0 Torr·s). Accordingly, the partial pressure of the precursor 10 during the precursor dosing step may be adjusted, and the precursor dose regime may be, for example, between 0.1 Torr·s and 5.0 Torr·s in one embodiment, and between 0.01 Torr·s and 1.0 Torr·s in another embodiment. The dosing condition may also be selected in view of the substrate temperature and the precursor type. In conventional ALD methods, the film growth rate is extremely low when the precursor dose is low (e.g., <5.0 Torr·s) and in some cases the film may not grow at all under these conditions. The methods of ALD discussed in various embodiments of this application with additional plasma treatment may advantageously overcome this issue through surface modification by the plasma treatment.

Further, in various embodiments, the precursor dosing step may be performed at a low-temperature regime (e.g., <450° C.). In one embodiment, the temperature of the substrate 100 may be maintained between 25° C. and 450° C., for example, at 400° C.

In various embodiments, the target film to deposit may comprise silicon and the precursor 10 may comprise silicon. In certain embodiments, the precursor 10 may comprise dichlorosilane (DCS). In other embodiments, other silane compounds may be used as the precursor 10, including but not limiting to, tris(dimethylamino)silane (TDMAS), bis(tertiary-butyl-amino)silane (BTBAS), trisilylamine (TSA), and neopentasilane (NPS).

Figure 1B:
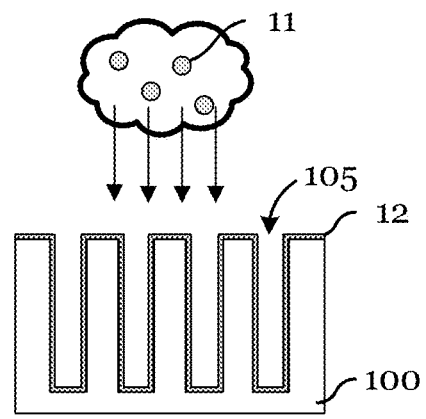

FIG. 1B illustrates a cross sectional view of the substrate 100 during a plasma treatment in accordance with an embodiment.

In a conventional ALD method, an activation step may follow immediately after the precursor dosing step and the purge step to start a self-limiting film growth. In contrast, various embodiments of the methods of this disclosure may insert an additional plasma treatment prior to the activation step. The additional plasma treatment may comprise first purging the plasma processing chamber with an inert gas (e.g., He, Ne, Ar, Kr, or Xe) and then generating a plasma from the inert gas to treat the surface of the substrate 100 and the adsorbed precursor.

As illustrated in FIG. 1B, the substrate 100 may be exposed to a plasma comprising positive ions 11, resulting in a modified surface 12. The modified surface 12 may comprise chemisorbed species of the precursor 10, reactive intermediates generated from the decomposition of the precursor 10, and physisorbed species thereof. In certain embodiments, the modified surface 12 may have a thickness of a monolayer. In various embodiments, the plasma for the plasma treatment may be generated from an inert gas such as argon (Ar), and thereby the positive ions 11 may comprise $Ar^+$. In certain embodiments, the inert gas may be continuously flowed since the precursor dosing step, and the plasma treatment may be started by terminating the flow of the precursor 10 and generating the plasma.

Further, in various embodiments, the plasma step may be performed at a low-temperature regime (e.g., <450° C.). In one embodiment, the substrate temperature may be maintained between 250° C. and 450° C., for example, at 400° C.

The plasma treatment may use a RF plasma with a frequency between about 0.1 MHZ to about 6 GHz. In certain embodiments, the RF plasma may be powered by two power sources to provide a low frequency RF power and a high frequency RF power at the same time. The plasma processing chamber may be configured to generate a capacitively coupled plasma (CCP), an inductively coupled plasma (ICP) plasma, or comprise a resonator such as a helical resonator. Further, microwave plasma (MW) or other suitable plasma systems may also be used.

In various embodiments, the source power for the plasma treatment may be adjusted such that it provides sufficient energy to cause some surface modification (or rearrangement) on the substrate 100 but not to cause substantial sputtering. If the energy is too large, the adsorbed precursor may desorb or be sputtered away from the surface. For these reasons, in certain embodiments, the source power for the plasma treatment may be lower than the source power used for a subsequent activation step. In one or more embodiments, the ion energy provided by the plasma during the plasma treatment may be between around 1 eV and 100 eV. Accordingly, when the ion energy during the plasma treatment needs to be reduced, the plasma process conditions may be adjusted by increasing a chamber pressure or increasing a RF frequency.

In one or more embodiments, the additional plasma treatment is performed across the entire surface of the substrate 100. For example, the plasma treatment is tailored to minimize across-wafer variations and form a uniform modified surface 12 over the substrate 100. In another embodiment, the additional plasma treatment may be performed on a selected part of a planar surface of the substrate 100 or a selected surface within 3D featured structures.

Although the plasma treatment of the methods of ALD is described in this disclosure primarily as a plasma treatment using only an inert gas (e.g., Ar), in other embodiments, the plasma treatment may also use chemically reactive species (e.g., radicals) or other positive or negative ions. In one or more embodiments, the plasma may be generated from a gas comprising $H_2$ or $N_2$.

Further, in certain embodiments, the plasma treatment may be replaced with a treatment driven by a different energy source. Such a treatment may comprise a non-plasma thermal process or a treatment with an electron beam, UV photon beam, electromagnetic (EM) wave (e.g., microwave).

Figure 1C:
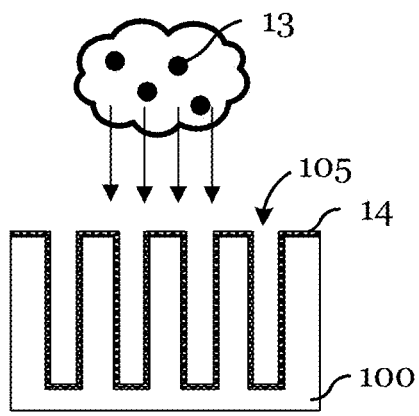

FIG. 1C illustrates a cross sectional view of the substrate 100 during an activation step in accordance with an embodiment.

After the plasma treatment, the activation step may be performed to further convert the modified surface 12 of FIG. 1B to a conformal layer 14. The activation step may comprise exposing the substrate 100 to an activation gas 13 in the absence or presence of a plasma. In case of using a plasma for the activation step as illustrated in FIG. 1C, a RF plasma with a frequency between about 0.1 MHz to about 6 GHz may be used in various embodiments. In certain embodiments, the RF plasma may be powered by two power sources to provide a low frequency RF power and a high frequency RF power at the same time. Similar to the plasma treatment described in FIG. 1B, any reasonable plasma system (e.g., ICP, CCP, and MW) may be used.

In various embodiments, the source power for the activation step using a plasma may be adjusted such that it provides sufficient energy to cause chemical reactions to form the conformal layer 14. In certain embodiments, the source power for the activation step may be higher than the source power used for the plasma treatment described in FIG. 1B.

Further, in various embodiments, the activation step may be performed at a low-temperature regime (e.g., <450° C.). In one embodiment, the substrate temperature may be maintained between 250° C. and 450° C., for example, at 400° C.

In various embodiments, the conformal layer 14 comprises the target layer to be formed by the ALD methods, and in various embodiments, it may comprise dielectric (e.g., nitride, oxide, or carbide) or metal materials. In certain embodiments, the conformal layer 14 may comprise silicon nitride. In various embodiments, the activation gas 13 may comprise a second precursor to be incorporated in the conformal layer 14. For example, in certain embodiments where the target layer may be silicon nitride, the precursor 10 may comprise silicon and the activation gas 13 may comprise nitrogen. Examples of nitrogen-containing gas for the activation gas 13 may include but is not limited to ammonia ($NH_3$), dinitrogen ($N_2$), hydrazine ($N_2H_4$), methylamine ($CH_3NH_2$), or the like. In one or more embodiments, the activation gas 13 may further comprise a carrier gas such as He, Ne, Ar, Kr, Xe, or $N_2$.

In other embodiments, the target film may comprise a different silicon dielectric material, and may comprise silicon carbide (SiC), silicon oxygen carbide (SiCO), silicon oxynitride (SiON), silicon carbon nitride (SiCN) or other materials. Further, the target film may comprise non-silicon-based oxides, carbides, or any other materials, for example, comprising boron (B), hydrogen (H), nitrogen (N), oxygen (O), carbon (C), or fluorine (F). These dielectric materials such as nitride materials may be advantageously used in the manufacture of microelectronic devices as barrier layers, passivation layers, dielectric layers, mask layers, and as substrates among others. In further embodiments, the target film may comprise a binary, ternary, tetranary compound that comprises a metal element such as titanium (Ti), iron (Fe), cobalt (Co), copper (Cu), zinc (Zn), gallium (Ga), germanium (Ge), arsenic (As), yttrium (Y), zirconium (Zr), indium (In), tin (Sn), antimony (Sb), hafnium (Hf), tantalum (Ta), or tungsten (W). In certain embodiments, the target film may comprise a metal nitride. In certain embodiments where the target layer comprises an oxide or metal, the activation gas 13 may comprise an oxidative gas (e.g., $H_2O$, $O_2$ or $O_3$) or a reducing gas (e.g., $H_2$), respectively.

Figure 1D:
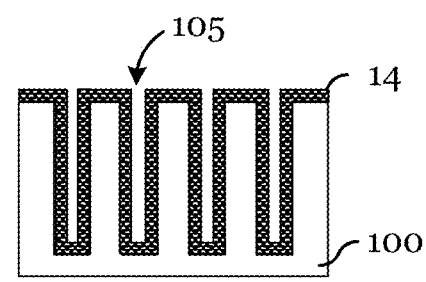

FIG. 1D illustrates a cross sectional view of the substrate 100 after cycles of ALD steps.

One cycle of ALD process (e.g., steps of FIGS. 1A-1C) may be expected to deposit approximately one monolayer of a film (e.g., the conformal layer 14) or less. The ALD steps of the precursor dosing, the plasma treatment, and the activation may therefore be cyclically repeated for any number of times to achieve a desired film thickness. In FIG. 1D, the conformal layer 14 with a thickness (e.g., >10 nm) substantially greater than a monolayer (e.g., ~2.5 Å) may be formed by the cycles of ALD steps described above.

Although not wishing to be limited by any theory, the plasma treatment prior to the activation step as described in various embodiments may improve the film growth during ALD because of precursor activation, inhibitor removal, or both as further described referring to FIGS. 2A-2D.

FIGS. 2A-2D illustrate two possible mechanisms for surface modification induced by a plasma treatment in accordance with various embodiments. It should be noted that the surface of the substrate in FIGS. 2A-2D is illustrated to have —NH/—$NH_2$ surface groups with the assumption of a preceding ALD cycle to deposit a nitride material, but in other embodiments, any surface functional groups (e.g., —OH group) may be present and the following description may still be applicable. Further, although the possible mechanisms below are primarily described based on the effect of the bombardment of positive ions (e.g., $Ar^+$ in FIGS. 2A and 2C), the surface modification may be induced by other factors such as UV, vacuum UV (VUV), electrons, or hot neutrals present in the plasma.

FIG. 2A schematically illustrates the decomposition of adsorbed precursors during the plasma treatment, and FIG. 2B schematically illustrates the resulting dissociative adsorption after the decomposition in FIG. 2A.

In FIGS. 2A-2D, an example of silicon nitride film deposition by ALD using dichlorosilane (DCS) as a Si-precursor is illustrated. The plasma treatment in this example is based on Ar plasma, causing ion bombardment with $Ar^+$ species to modify the surface. As illustrated in FIG. 2A, after the precursor dosing step, some of DCS may already be chemically bonded to the surface group via chemisorption with N—Si bonds (e.g., NH—$SiH_2$Cl species in FIG. 2A) while other precursors (e.g., remaining DCS in FIG. 2A) are only physisorbed without forming a chemical bond with the surface. Because the physisorbed species are only weakly adsorbed, without any treatment, they may easily desorb from the surface during subsequent steps or fail to form a high quality film. On the other hand, by inserting the plasma treatment, the bombardment of positive ions (e.g., $Ar^+$ in FIG. 2A) may decompose physisorbed DCS (e.g., two arrows from DCS in FIG. 2A) and generate more reactive intermediates (e.g., Cl—Si—H species in FIG. 2A) and by-products (e.g., HCl in FIG. 2A). Some of these reactive intermediates (e.g., Cl—Si—H species circled in FIG. 2A) may then be chemisorbed onto the surface as illustrated in FIG. 2B, increasing the Si-species that may be activated in the subsequent activation step. In addition to the dissociative adsorption, other surface rearrangements such as H-desorption from the precursor or the surface and dangling bond formation may also contribute to the improved precursor adsorption.

FIG. 2C illustrates the removal of by-products generated from deposition during the plasma treatment as another possible mechanism of the surface modification, and FIG. 2D illustrates the improved adsorption after the removal in FIG. 2C.

In FIG. 2C, the removal of by-products generated from a previous cycle of the deposition is illustrated. Any by-products or residues from prior cycles of the ALD (e.g., $NH_4Cl$ and HCl in FIG. 2C) may be present on the surface and potentially inhibit the next cycle of ALD by blocking the otherwise available adsorption sites on surface. As illustrated in FIG. 2C, the ion bombardment by the plasma treatment (e.g., $Ar^+$ in FIG. 2C) may advantageously clear the surface by removing the by-products or residues (e.g., $NH_4Cl$ and HCl circled in FIG. 2C), allowing more precursor molecules (e.g., DCS in FIG. 2D) to adsorb on the surface.

Figure 3A:
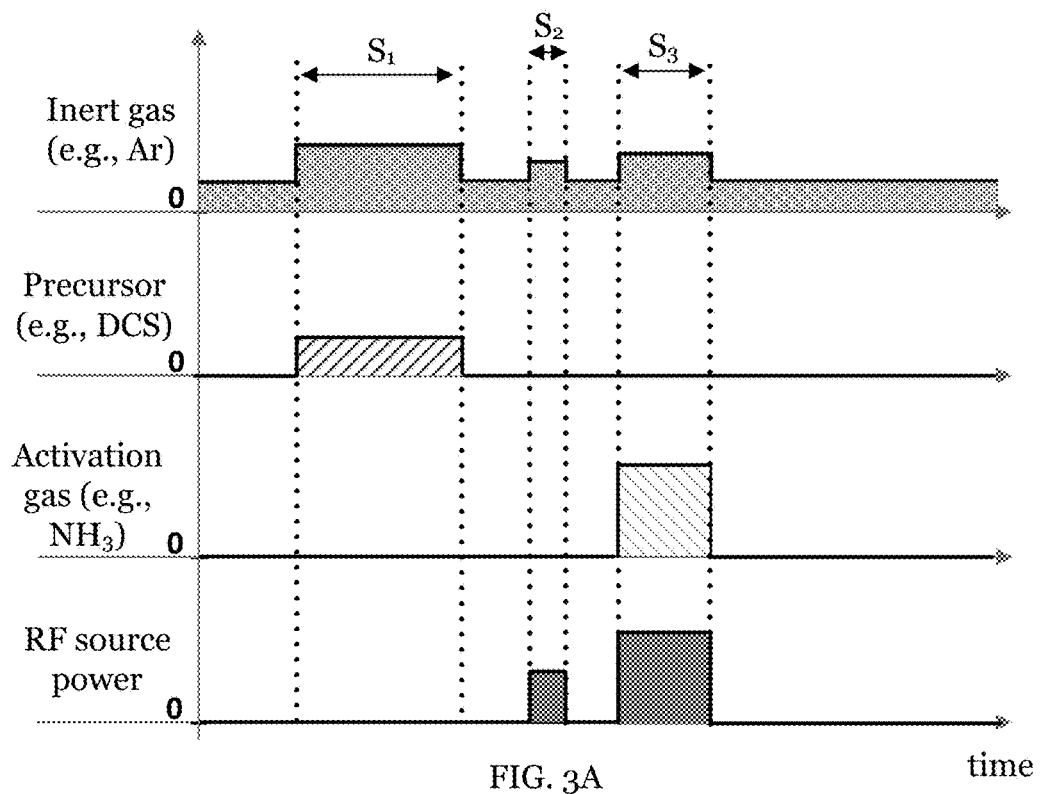
Figure 3B:
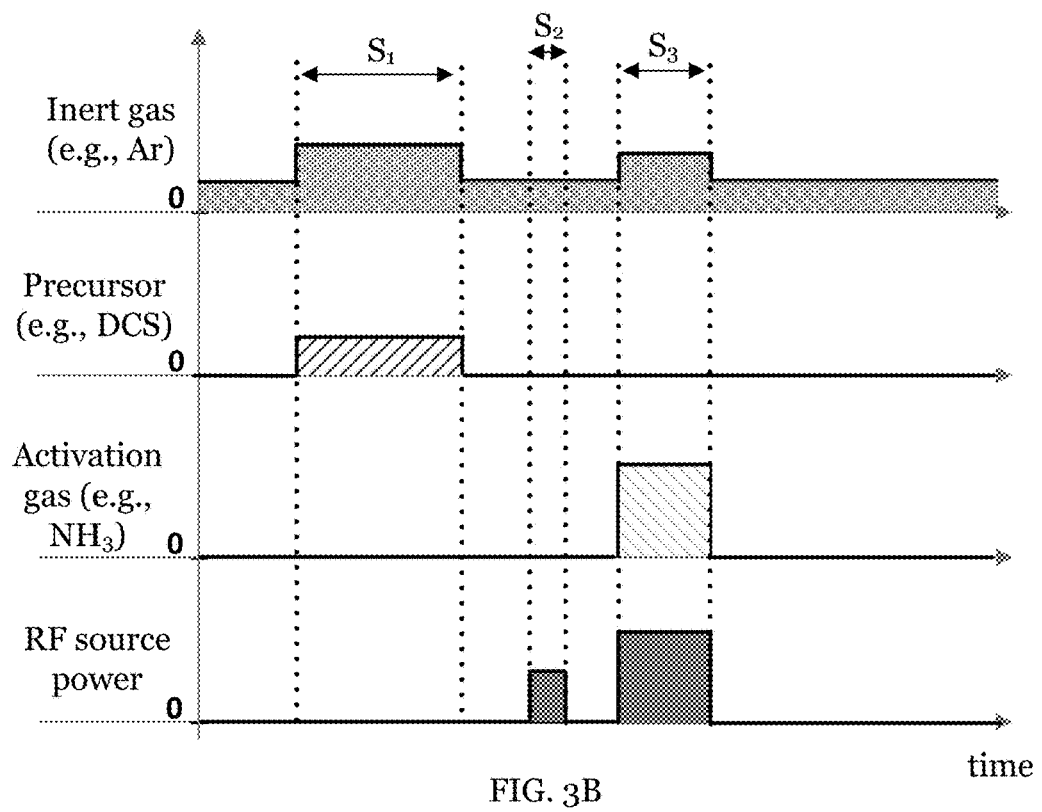
Figure 3C:
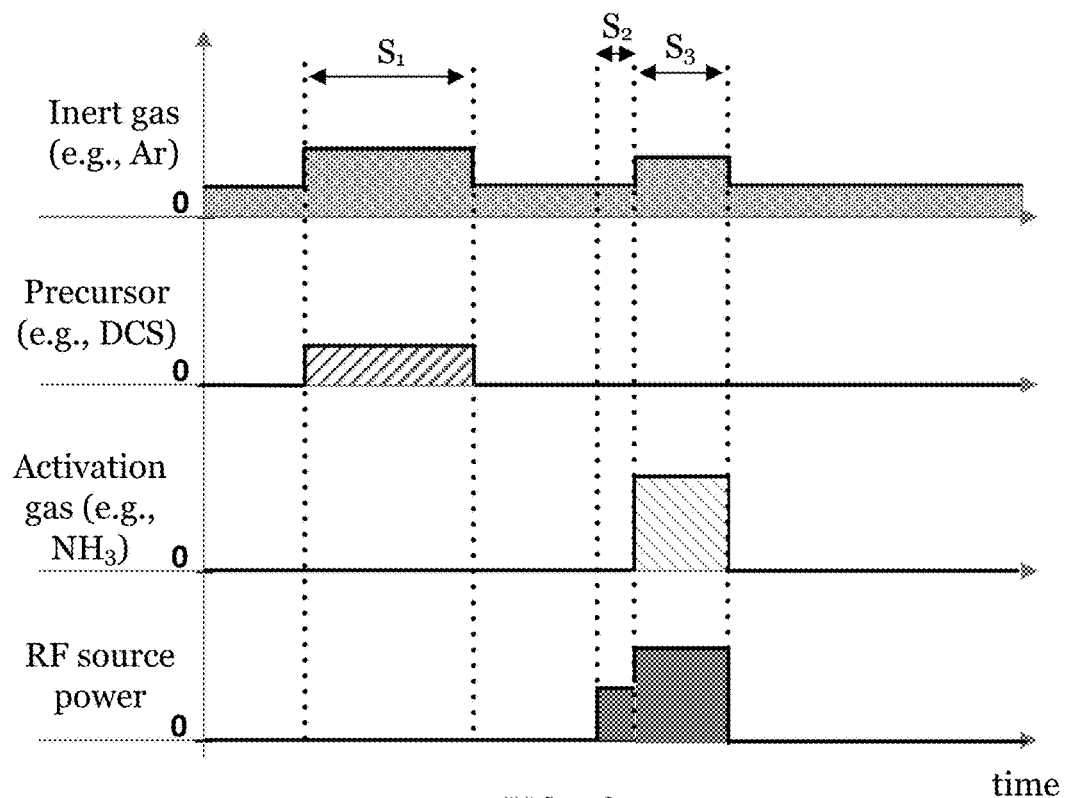

FIG. 3A-3E illustrate example timing diagrams for one cycle of ALD process in accordance with various embodiments. FIGS. 3A-3C illustrates various embodiments with an additional plasma treatment inserted between a precursor dosing step and an activation step.

In FIGS. 3A-3E, four process parameters (i.e., three gas flow rates and radio frequency (RF) source power for plasma generation) are illustrated, where the x-axis represents progression in time and the y-axis represents the intensity of each of the four process parameters. The three ALD steps as described above (i.e., the precursor dosing step, the plasma treatment, and the activation step) are noted as $S_{1-3}$ in FIG. 3A, respectively. As illustrated in FIG. 3A, each step may be temporally separated to each other by purge steps.

In various embodiments, an inert gas such as Ar may be flowed during the entirety of one cycle of ALD process. In addition, the flow rate of the inert gas may be advantageously adjusted for each of the steps $S_1$, $S_2$, and $S_3$, and each step may use a different gas flow for the inert gas to each other. As illustrated in FIG. 3A, these inert gas flows may be different from those for the purge steps in one embodiment, and in another embodiment, the gas flow for the plasma treatment ($S_2$) may be the same as the purge steps as illustrated in FIG. 3B. For example, the inert gas flow rate for $S_2$ may be kept lower than that for Si to control the energy of the ion bombardment during the plasma treatment in one embodiment, which may be advantageous to reduce the chamber pressure and improve the process uniformity across the substrate. In another embodiment, the inert gas flow rate for $S_2$ may be kept higher than those for $S_1$ and $S_3$ to reduce the ion energy and increase the ion angle distribution Further, in certain embodiments, the method may comprise changing the inert gas flow composition and flow rate during the ALD cycle, at the start of $S_1$, $S_2$, $S_3$ steps, which may be simultaneously performed with, for example, starting the flow of the precursor or the activation gas, or powering the RF power source. For example, a first inert gas (e.g., Ar) may be used for $S_1$ and $S_3$, and a second inert gas (e.g., He) may be used for $S_2$. Using a lighter element (e.g., He) for the plasma treatment ($S_2$) may advantageously minimize the undesired physical sputtering of the adsorbed precursor species. In yet another embodiment, the flow rate of the inert gas may kept constant throughout the cycle of the ALD process, or more than one gas may be used for the inert gas and the plasma treatment.

In other embodiments, some of the steps $S_1$, $S_2$, and $S_3$ may be temporally overlapped or some purge steps may be skipped. For example, in one embodiment illustrated in FIG. 3C, the activation step ($S_3$) may start immediately after the plasma treatment ($S_2$) by starting the flow of the activation gas and increasing the RF source power.

Figure 3D:
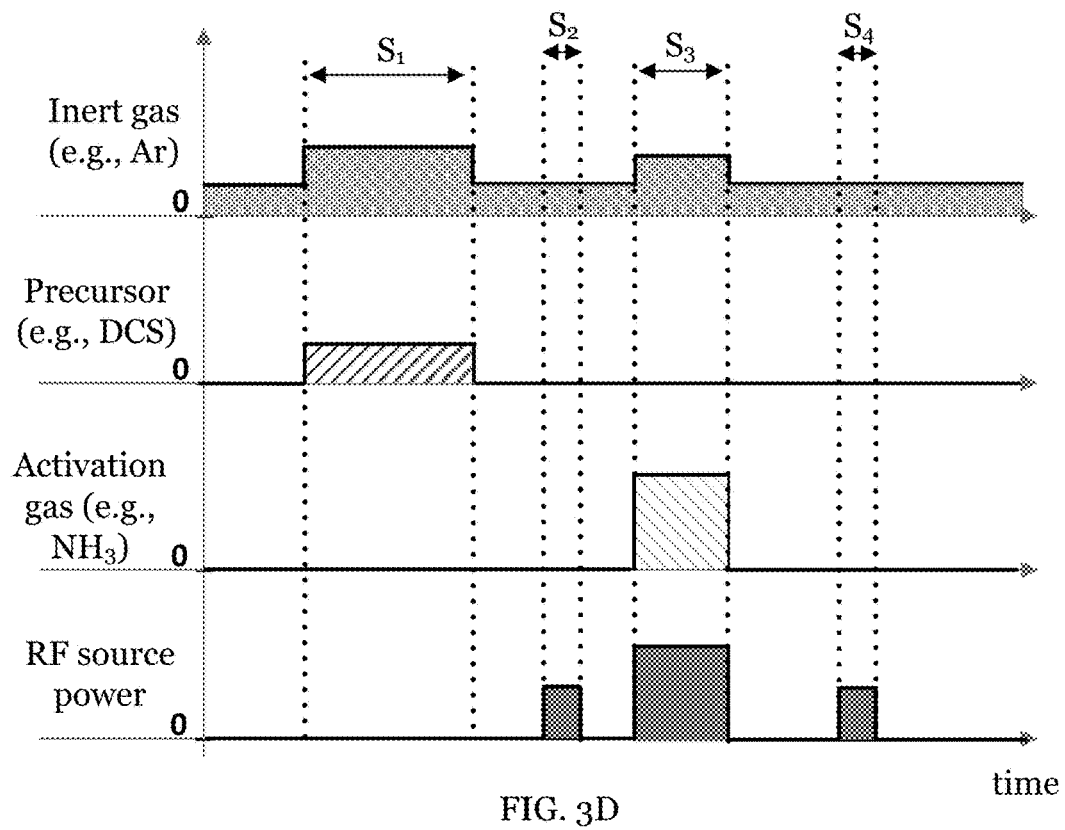

FIG. 3D illustrates another example timing diagram for one cycle of ALD process with two additional plasma treatments.

In FIG. 3D, in addition to the three ALD steps $S_1$-$S_3$ as described in FIGS. 3A-3C, a second additional plasma treatment $S_4$ may be inserted after the activation step. This second additional plasma treatment after activation may essentially be the same as the first additional plasma treatment $S_2$ and may comprise first purging the plasma processing chamber with an inert gas (e.g., He, Ne, Ar, Kr, Xe, or $N_2$) and then generating a plasma from the inert gas to treat the surface of the substrate. This extra plasma treatment may help removing by-products formed during the activation step and clearing the surface for the next cycle of ALD process.

Figure 3E:
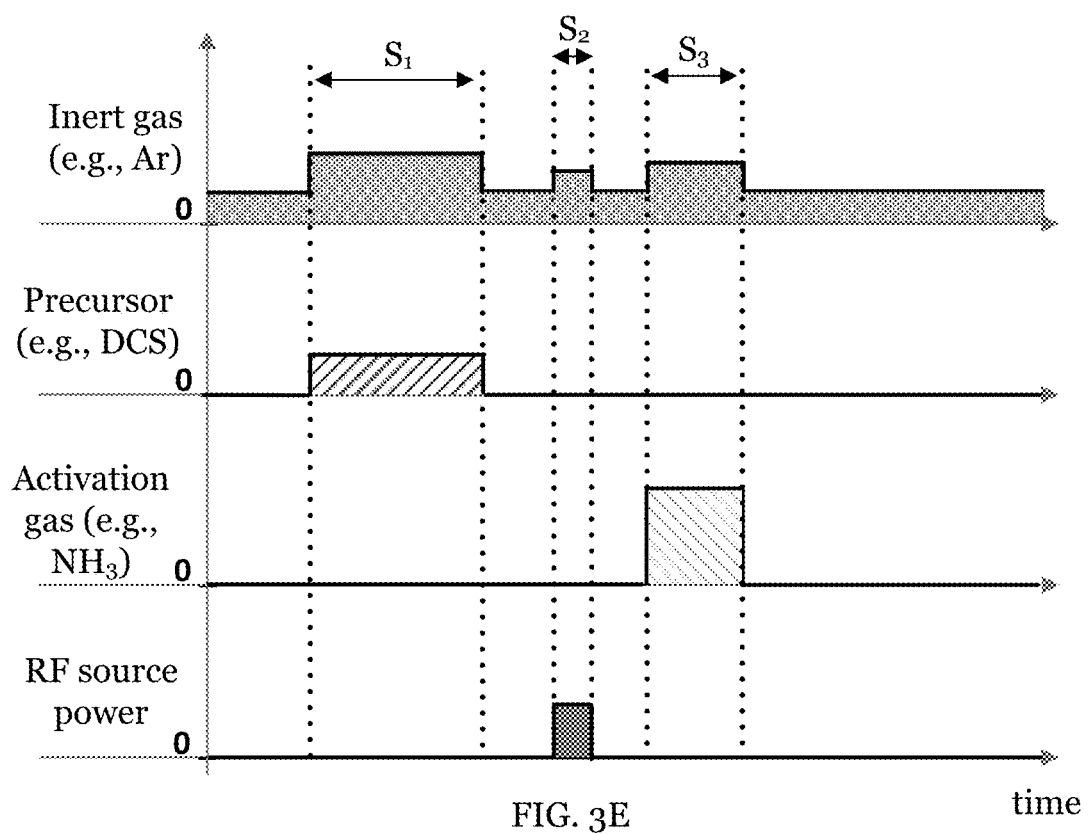

In FIG. 3E, in accordance with another embodiment, the activation step ($S_3$) may be replace with a non-plasma treatment such as a thermal treatment. In this embodiment, as illustrated in FIG. 3E, the activation step ($S_3$) may be performed without powering the RF power source. With the plasma treatment ($S_2$) being the only plasma step, this embodiment may be regarded as a thermal ALD process with an additional plasma treatment inserted.

FIGS. 3A-3E illustrate only one cycle of the ALD process, and in certain embodiments, any process parameters (e.g., process time for each step or RF source power) may be adjusted for each cycle. One or more cycles during the ALD process may also skip one or more of additional plasma treatments ($S_2$ or $S_4$). In certain embodiments, any step of the ALD process may be repeated separately or repeated as a sub-cycle within one cycle. Further, although the RF power is illustrated only once per step ($S_2$ or $S_4$) in FIGS. 3A and 3B, a pulsed RF power may also be used in various embodiments. Although not specifically described in FIGS. 3A-3E, any other process parameters such as substrate temperature may also be controlled independently and/or changed at each stage of the ALD process in accordance with the respective process recipe.

Figure 4A:
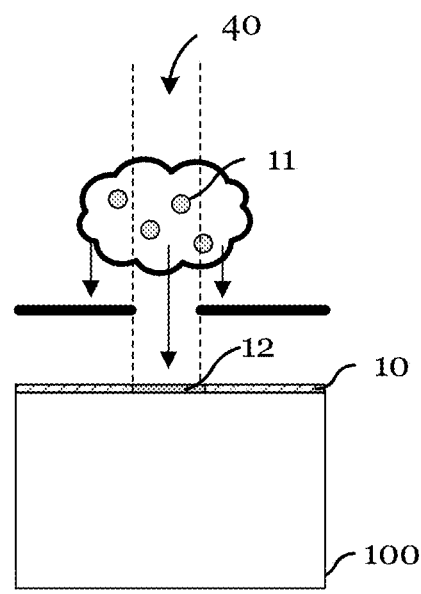
Figure 4B:
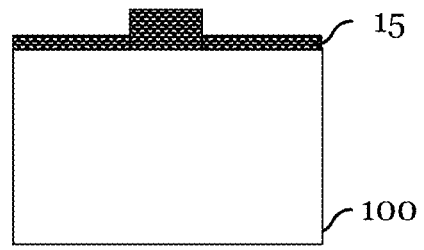

FIGS. 4A-4B illustrate cross sectional views of a substrate 100 at various stages during an atomic layer deposition (ALD) process in accordance with various embodiments. FIG. 4A illustrates a substrate during a plasma treatment with a photomask to enable area selective film growth and FIG. 4B illustrates the substrate after cycles of ALD steps. The substrate 100 is illustrated to have a flat surface with no recess feature only for illustration purpose, and may have a same composition or structural features as described above with FIG. 1A, and thus the details will not be repeated.

In prior embodiments, the additional plasma treatment (e.g., FIG. 1B) is described to bombard the entirety of the substrate 100 such that the modified surface 12 may be formed uniformly across the substrate. In certain embodiments, the additional plasma treatment may be performed only on a selected area of the substrate 100, enabling area selective ALD.

In FIG. 4A, a precursor dosing step has been performed as described previously referring to FIG. 1A to form a layer of the adsorbed precursor 10. The substrate 100 may then be subject to a plasma treatment similar to FIG. 1B but only for a selected area, for example, by opening an exposure window 40 to expose the selected area while shielding the remaining area from being exposed to the plasma. As a result, the modified surface 12 may be formed only on the selected area (e.g., a central area in FIG. 4A). After this area-selective plasma treatment, the activation step may follow as described previously referring to FIG. 1C. These three steps may be repeated to continue the film growth. Because only the selected area may benefit from the improved film growth, the cycles of ALD process in this embodiment may enable the deposition of a film 15 having a controlled thickness difference as illustrated in FIG. 4B. In certain embodiments, the area-selective plasma treatment may be enabled by controlling the ion directionality of the ions during the plasma treatment step. In one embodiment, the substrate 100 may comprise a recess feature and the ions may be directed to bombard primarily the bottom opening surface (i.e. recess bottom surface), thereby allowing bottom-up film growth. In another embodiment, the ion may be directed to have a large angle, for example, by using high frequency and high chamber pressure. With such a high-angle ion bombardment, the top and top-side surfaces on a recess feature may preferentially be treated, enabling preferential film growth on the treated surfaces. For example, preferential SiN film growth only near the top openings of recesses may particularly be useful as area-selective spacer deposition, or other semiconductor device fabrication. Further, the area-selective film growth enabled by these embodiments may be used to form voids or airgaps in the feature uniformly across the substrate 100.

Figure 5A:
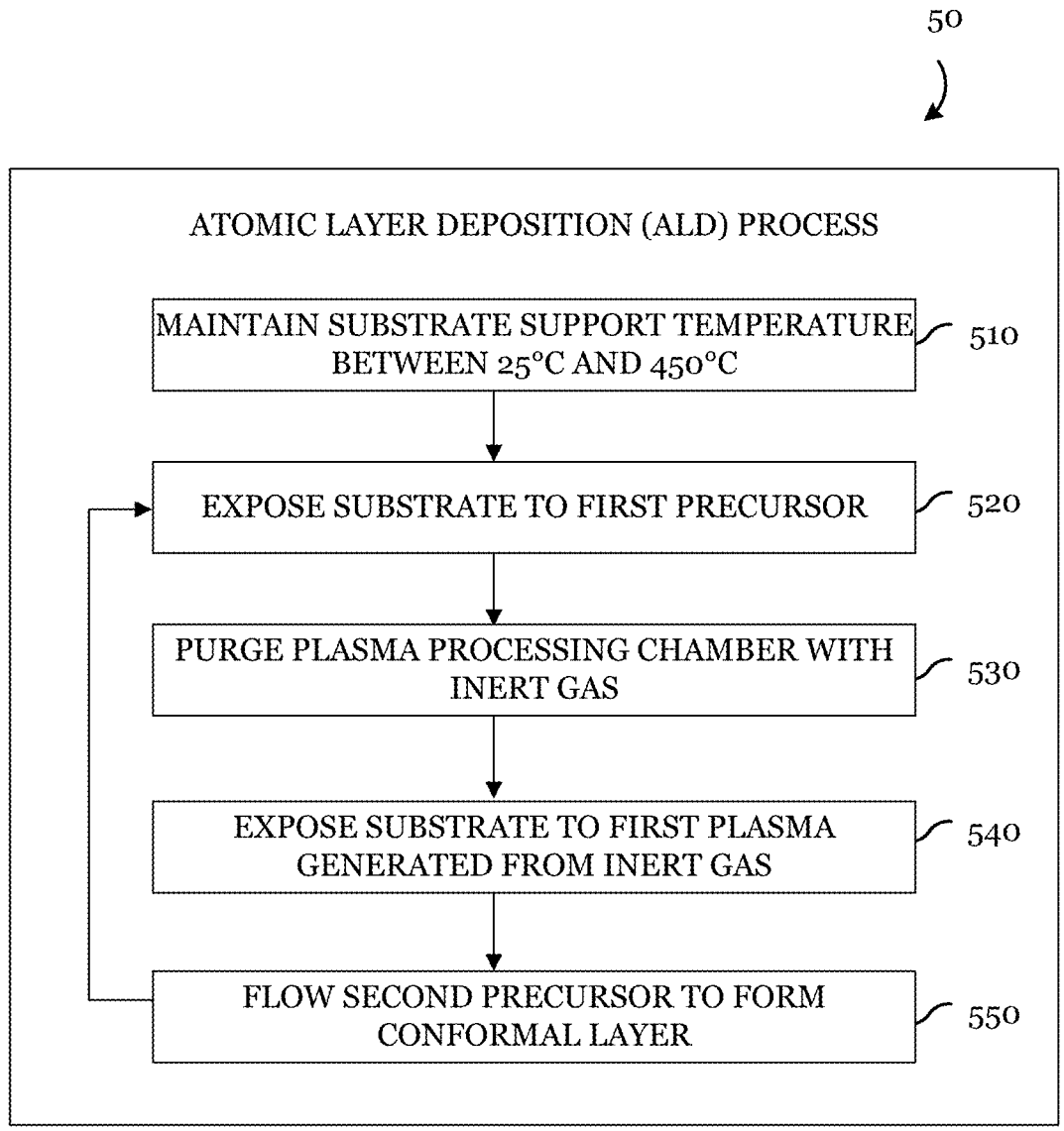
Figure 5B:
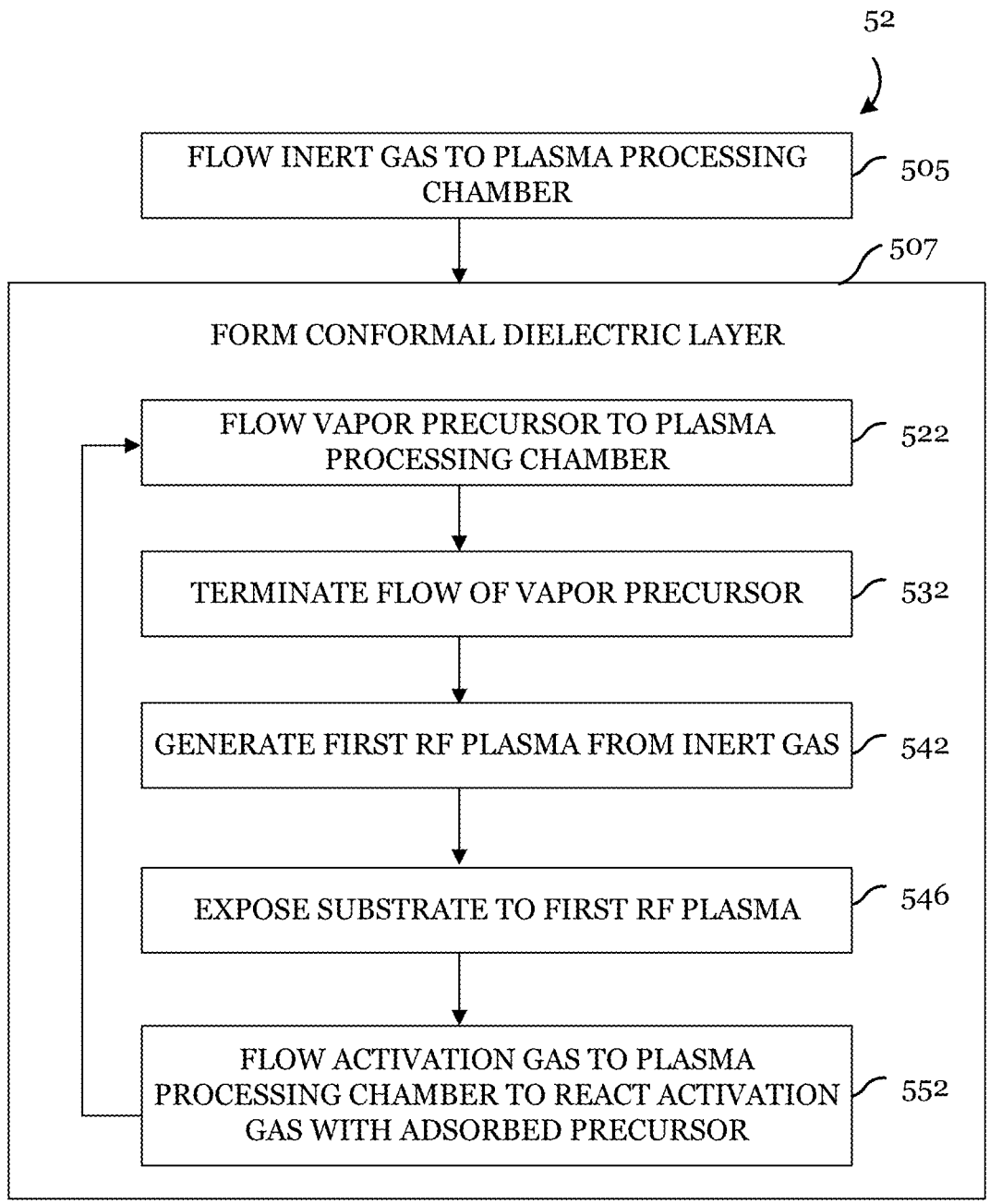
Figure 5C:
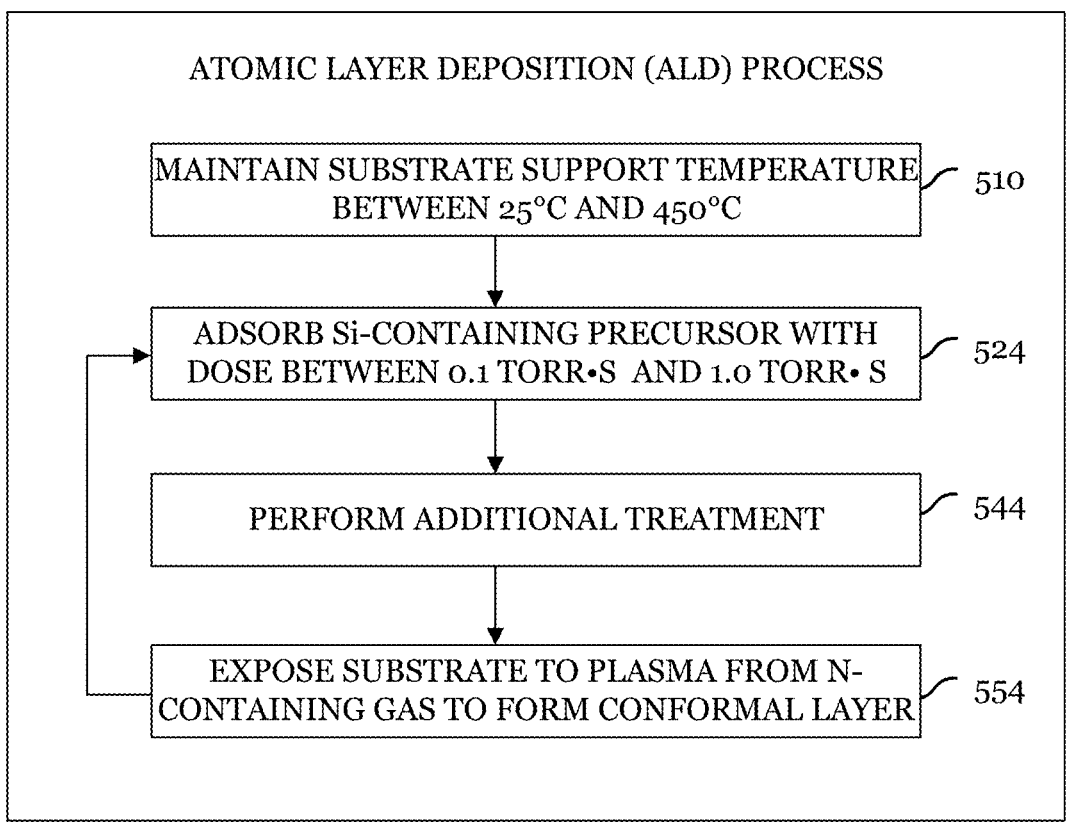

FIGS. 5A-5C illustrate process flow diagrams of the methods of ALD process in accordance with various embodiments. The process flow can be followed with the figures (FIGS. 1A-1C and 3) discussed above and hence will not be described again.

In FIG. 5A, a process flow 50 of an atomic layer deposition (ALD) process starts with maintaining a temperature of the substrate between 25° C. and 450° C. (block 510), followed by exposing a substrate loaded in a plasma processing chamber to a first precursor to modify the surface of the substrate with the first precursor (block 520, FIG. 1A). Next, the plasma processing chamber may be purged with an inert gas (block 530), and the modified surface of the substrate may be exposed to a first plasma generated from the inert gas (block 540, FIG. 1B). The adsorbed precursor may then be reacted with a second precursor to form a conformal layer (block 550, FIG. 1C). This cycle of film deposition steps (blocks 520-550) may be repeated for any number of times to grow a film with a target thickness (FIG. 1D).

In FIG. 5B, another process flow 52 starts with flowing an inert gas to a plasma processing chamber (block 505), and then while flowing the inert gas, the process proceeds to forming a conformal dielectric layer over the substrate (block 507). To form the conformal dielectric layer, first a vapor precursor may be flowed to the plasma processing chamber in the absence of a plasma such that a portion of the vapor precursor adsorbs on a surface of the substrate (block 522, FIG. 1A). Subsequently, the flow of the vapor precursor may be terminated (block 532), and a first RF plasma may be generated from the inert gas in the plasma processing chamber (block 542), followed by exposing the substrate to the first RF plasma (block 546, FIG. 1B). An activation gas may then be flowed to the plasma processing chamber to react the activation gas with the adsorbed precursor to form the conformal dielectric layer (block 552, FIG. 1C).

In FIG. 5C, an alternate process flow 54 of an atomic layer deposition (ALD) process starts with maintaining a temperature of the substrate between 25° C. and 450° C. (block 510), followed by adsorbing a Si-containing precursor on the substrate with a dose of the Si-containing precursor being between 0.1 Torr·s and 5.0 Torr·s (block 524, FIG. 1A). Next, an additional treatment may be performed to induces a decomposition of the Si-containing precursor and dissociative adsorption, to remove a side-product generated during a previous cycle of deposition from the substrate, or both (block 544, FIG. 1B). As described above, this additional treatment may comprise a plasma process, a non-plasma thermal process, an electron beam process, a UV photon beam process, or an electromagnetic (EM) wave process. The adsorbed Si-containing precursor may then be reacted with a nitrogen-containing precursor by exposing the substrate to a plasma generated from a gas comprising nitrogen (block 554, FIG. 1C). This cycle of film deposition steps (blocks 524-554) may be repeated for any number of times to grow a film with a target thickness (FIG. 1D).

As described above, various embodiments may insert an additional plasma treatment using an inert gas in atomic layer deposition (ALD) process, which may advantageously improve the film growth rate. The inventors of this application experimentally demonstrated a significant enhancement in the growth per cycle (GPC) of a silicon nitride film based on the methods particularly in the low-temperature and low-precursor dose regimes. In the experiments, dichlorosilane (DCS), Ar, and $NH_3$ were used for the precursor, the inert gas, and the activation gas, and the precursor dosing step was performed at only 0.23 Torr·s and 450° C. After 20 ALD cycles with the additional plasma treatment, the silicon nitride film was characterized by Fourier-transform infrared spectroscopy (FTIR), X-ray photoelectron spectroscopy (XPS), and ellipsometry. Based on the ellipsometry data, the thickness of the silicon nitride film was determined to be 5.2 nm, which corresponds to the GPC of 2.3-2.8 Å with an assumption of 1-2 nm boundary native oxide. This high GPC is comparable to a monolayer per cycle (~2.5 Å), and more than one order of magnitude greater than a reference GPC data (~0.16 Å) obtained from an experiment with a conventional method under the same condition without any additional plasma treatment. It was also found that the conventional method even at a high precursor dosing (~ 10 Torr·s) resulted in a GPC of only ~0.9 Å.

The FTIR analysis further provides support for the effect of the plasma treatment. First, there was no monotonic growth of a peak attributed to $NH_4Cl$ as incrementing ALD cycles. $NH_4Cl$ is a by-product that may inhibit precursor adsorption in subsequent cycles, and thus preventing its accumulation with ALD cycles may be advantageous. Second, the FTIR confirmed a continuous growth of peaks attributed to N—H bonds from the silicon nitride film as incrementing ALD cycles, indicating the successful growth of the film with a minimal inhibition from by-products thanks to the inserted plasma treatments.

Figure 6A:
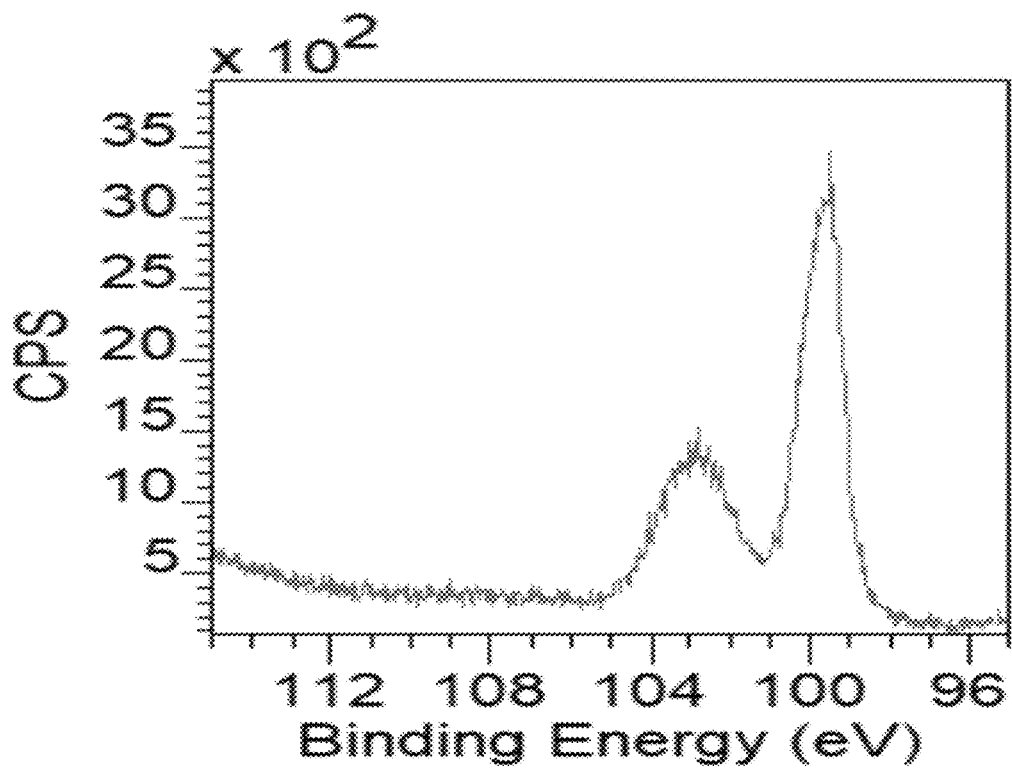
Figure 6B:
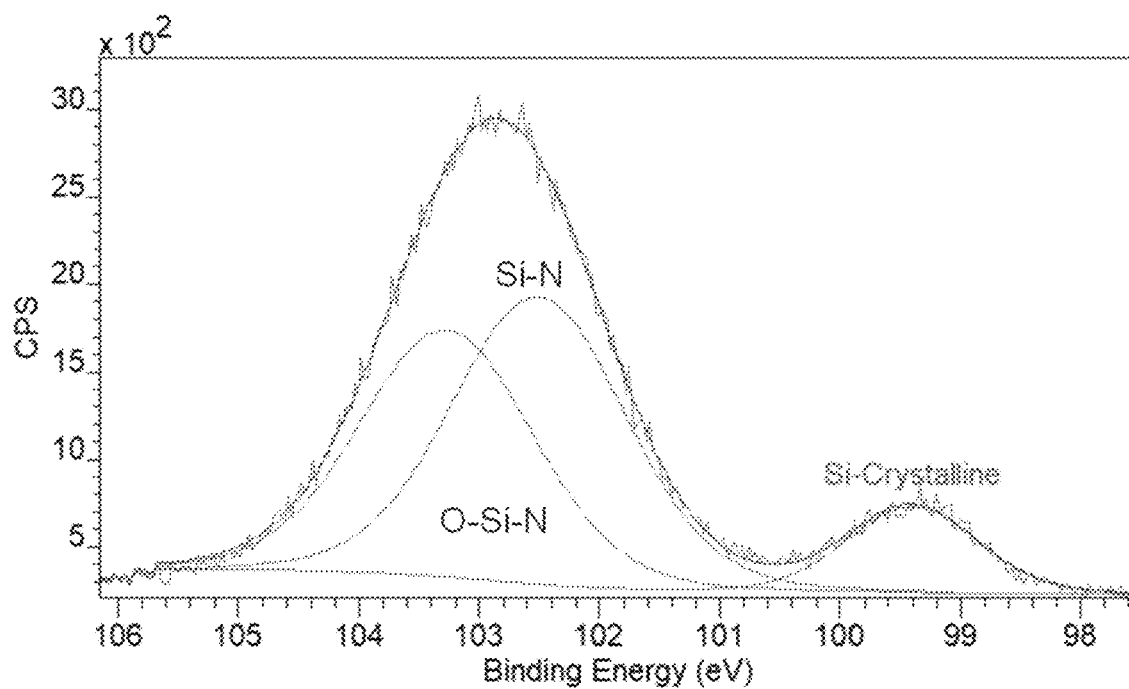

FIGS. 6A-6B illustrate example X-ray photoelectron spectra (XPS) of a substrate after ALD process. FIG. 6A illustrates a Si 2p XPS spectrum of the substrate after an ALD process without any additional plasma treatment and FIG. 6B illustrates a Si 2p XPS spectrum of the substrate after a ALD process with an additional plasma treatment in accordance with one embodiment.

In FIG. 6A, the Si 2p XPS spectrum represents the film after 60 ALD cycles at the low precursor dose and low temperature (0.23 Torr·s and 450° C.). The Si—Si peak from the silicon substrate at 99-100 eV is greater than the Si—N peak from the silicon nitride film at 102-103 eV. In FIG. 6B, on the other hand, the Si 2p XPS spectrum represents the film after 20 ALD cycles at the same low precursor dose and low temperature, but each cycle included the additional plasma treatment based on the methods of ALD in accordance with one embodiment. Despite only 20 ALD cycles, the Si—N peak in FIG. 5B is greater than the Si—Si peak, evidencing the substantially greater film growth per cycle by the method with the additional plasma treatment.

Example embodiments of the invention are summarized here. Other embodiments can also be understood from the entirety of the specification as well as the claims filed herein.

Example 1. A method of processing a substrate that includes: in a plasma processing chamber, performing an atomic layer deposition (ALD) process including cycles of deposition while maintaining a temperature of a substrate support between 25° C. and 450° C., one of the cycles including exposing the substrate loaded in a plasma processing chamber to a first precursor to modify a surface of the substrate with the first precursor, after exposing the substrate, purging the plasma processing chamber with an inert gas, exposing the modified surface of the substrate to a first plasma generated from the inert gas, and flowing a second precursor into the plasma processing chamber, after exposing to the first plasma, to form a conformal layer from the modified surface.

Example 2. The method of example 1, where a dose of the first precursor in one of the cycles is between 0.1 Torr·s and 5.0 Torr·s.

Example 3. The method of one of examples 1 or 2, where exposing the substrate to the first precursor is performed in the absence of a plasma.

Example 4. The method of one of examples 1 to 3, where forming the conformal layer includes exposing the substrate to a second plasma generated from a gas including the second precursor.

Example 5. The method of one of examples 1 to 4, where one of the cycles further includes, after the forming, purging the plasma processing chamber with an inert gas.

Example 6. The method of one of examples 1 to 5, where the one of the cycles further includes, after the forming and purging the plasma processing chamber with the inert gas, exposing the substrate to a third plasma generated from the inert gas.

Example 7. The method of one of examples 1 to 6, where the first precursor includes silicon, where the second precursor includes nitrogen, and where the conformal layer includes silicon nitride.

Example 8. The method of one of examples 1 to 7, where the first precursor includes dichlorosilane (DCS).

Example 9. The method of one of examples 1 to 8, where the second precursor includes ammonia ($NH_3$).

Example 10. A method of processing a substrate that includes: flowing an inert gas to a plasma processing chamber; while flowing the inert gas, forming a conformal dielectric layer over the substrate, the forming including flowing a vapor precursor into the plasma processing chamber in the absence of a plasma, a portion of the vapor precursor being adsorbed on a surface of the substrate, after terminating the flow of the vapor precursor, generating a first RF plasma from the inert gas in the plasma processing chamber and exposing the substrate to the first RF plasma, flowing an activation gas to the plasma processing chamber to react the activation gas with the adsorbed vapor precursor to form the conformal dielectric layer.

Example 11. The method of example 10, where the forming further includes maintaining a temperature of a substrate support between 25° C. and 450° C.

Example 12. The method of one of examples 10 or 11, where a dose of the vapor precursor when flowing the vapor precursor is between 0.1 Torr·s and 5.0 Torr·s.

Example 13. The method of one of examples 10 to 12, where the forming further includes exposing the substrate to a second RF plasma generated from the activation gas and the inert gas.

Example 14. The method of one of examples 10 to 13, where the forming further includes generating the second RF plasma using a source power that is greater than a source power used for the first RF plasma.

Example 15. The method of one of examples 10 to 14, where the conformal dielectric layer has a thickness between 2 Å and 3 Å.

Example 16. A method of processing a substrate that includes: in a plasma processing chamber, performing an atomic layer deposition (ALD) process including cycles of deposition while maintaining a temperature of a substrate support between 25° C. and 450° C., each cycle of deposition including adsorbing a Si-containing precursor onto a surface of the substrate with a dose of the Si-containing precursor being between 0.1 Torr·s and 5.0 Torr·s, after adsorbing the Si-containing precursor, performing an additional treatment for the substrate that induces a decomposition of the Si-containing precursor and dissociative adsorption or that removes a side-product generated during a previous cycle of deposition from the substrate, and after the additional treatment the substrate, forming a conformal layer, the forming including exposing the substrate to a plasma generated from a gas including nitrogen.

Example 17. The method of example 16, where the additional treatment includes bombarding the substrate with positive ions.

Example 18. The method of one of examples 16 or 17, where the additional treatment includes treating the substrate with an electron beam.

Example 19. The method of one of examples 16 to 18, where the additional treatment includes treating the substrate with a UV photon beam.

Example 20. The method of one of examples 16 to 19, where the additional treatment includes treating the substrate with an electromagnetic (EM) wave.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:
   in a plasma processing chamber, performing an atomic layer deposition (ALD) process comprising cycles of deposition while maintaining a temperature of a substrate support between 25° C. and 450° C., each cycle of deposition comprising
   continuously flowing an inert gas at a first flow rate into the plasma processing chamber,
   adsorbing a Si-containing precursor onto a surface of the substrate with a dose of the Si-containing precursor being between 0.1 Torr·s and 5.0 Torr·s,
   after adsorbing the Si-containing precursor, performing an additional treatment for the substrate that induces a decomposition of the Si-containing precursor and dissociative adsorption or that removes a side-product generated during a previous cycle of deposition from the substrate, the additional treatment comprising simultaneously flowing the inert gas at a second flow rate higher than the first flow rate and applying radio frequency (RF) power to an electrode of the processing chamber to generate a first plasma, and
   after the additional treatment the substrate, forming a conformal layer, the forming comprising exposing the substrate to a second plasma generated from a gas comprising nitrogen, the second plasma being different from the first plasma of the additional treatment.

2. A method of processing a substrate, the method comprising:
   in a plasma processing chamber, performing an atomic layer deposition (ALD) process comprising cycles of deposition while maintaining a temperature of a substrate support between 25° C. and 450° C., one of the cycles comprising
   continuously flowing an inert gas at a first flow rate into the plasma processing chamber,
   exposing the substrate loaded in the plasma processing chamber to a first precursor to modify a surface of the substrate with the first precursor,
   after exposing the substrate to the first precursor and before flowing a second precursor, purging the plasma processing chamber with the inert gas,
   simultaneously flowing the inert gas at a second flow rate higher than the first flow rate and applying radio frequency (RF) power to an electrode of the plasma processing chamber to generate a first plasma and exposing the modified surface of the substrate to the first plasma generated from the inert gas, and
   flowing the second precursor into the plasma processing chamber, after exposing the substrate to the first plasma generated from the inert gas, to form a conformal layer from the modified surface, wherein, within the cycle, the first plasma is generated before flowing any of the second precursor.

3. The method of claim 2, wherein a dose of the first precursor in one of the cycles is between 0.1 Torr·s and 5.0 Torr·s.

4. The method of claim 2, wherein exposing the substrate to the first precursor is performed in the absence of a plasma.

5. The method of claim 2, wherein the first precursor comprises silicon, wherein the second precursor comprises nitrogen, and wherein the conformal layer comprises silicon nitride.

6. The method of claim 2, wherein the first precursor comprises dichlorosilane (DCS).

7. The method of claim 2, wherein the second precursor comprises ammonia (NH$_3$).

8. The method of claim 2, wherein forming the conformal layer comprises exposing the substrate to a second plasma generated from a gas comprising the second precursor.

9. The method of claim 8, wherein one of the cycles further comprises, after exposing the substrate to the second plasma, purging the plasma processing chamber with the inert gas.

10. The method of claim 9, wherein the one of the cycles further comprises, after exposing the substrate to the second plasma and purging the plasma processing chamber with the inert gas, exposing the substrate to a third plasma generated from the inert gas.

11. A method of processing a substrate, the method comprising:

flowing an inert gas to a plasma processing chamber; and while continuously flowing the inert gas, forming a conformal dielectric layer over the substrate using a cyclic deposition process, each cycle of the cyclic deposition process comprising flowing a vapor precursor into the plasma processing chamber in the absence of a plasma, a portion of the vapor precursor being adsorbed on a surface of the substrate, after terminating the flow of the vapor precursor, generating a first RF plasma from the inert gas in the plasma processing chamber and exposing the substrate to the first RF plasma, and after exposing the substrate to the first RF plasma, flowing an activation gas to the plasma processing chamber to react the activation gas with the adsorbed vapor precursor to deposit a layer of the conformal dielectric layer, wherein the forming further comprises exposing the substrate to a second RF plasma generated from the activation gas and the inert gas, wherein the forming further comprises generating the second RF plasma using a source power that is greater than a source power used for the first RF plasma.

12. The method of claim 11, wherein the forming further comprises maintaining a temperature of a substrate support between 25° C. and 450° C.

13. The method of claim 11, wherein a dose of the vapor precursor when flowing the vapor precursor is between 0.1 Torr·s and 5.0 Torr·s.

14. The method of claim 11, wherein the conformal dielectric layer has a thickness between 2 Å and 3 Å.

* * * * *